(12) United States Patent
Patapoutian et al.

(10) Patent No.: US 9,525,576 B1
(45) Date of Patent: Dec. 20, 2016

(54) SELF-ADAPTING PHASE-LOCKED LOOP FILTER FOR USE IN A READ CHANNEL

(71) Applicant: Seagate Technology LLC, Cupertino, CA (US)

(72) Inventors: Ara Patapoutian, Hopkinton, MA (US); Belkacem Derras, Longmont, CO (US); William Michael Radich, Longmont, CO (US); Michael J. Link, St. Paul, MN (US); Bruce Douglas Buch, Westborough, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/808,736

(22) Filed: Jul. 24, 2015

(51) Int. Cl.
*H04L 27/148* (2006.01)
*H04L 7/033* (2006.01)

(52) U.S. Cl.
CPC ........... *H04L 27/148* (2013.01); *H04L 7/0332* (2013.01)

(58) Field of Classification Search
CPC .............................. H04L 27/148; H04L 7/0332
See application file for complete search history.

(56) References Cited

U.S. PATENT DOCUMENTS

| | | | |
|---|---|---|---|
| 5,173,710 A * | 12/1992 | Kelley | G01S 5/0009 342/394 |
| 5,625,506 A | 4/1997 | Dovek et al. | |
| 5,754,437 A * | 5/1998 | Blazo | H04L 1/205 327/156 |
| 6,100,683 A | 8/2000 | Lim et al. | |
| 6,236,343 B1 * | 5/2001 | Patapoutian | G11B 20/1403 341/111 |
| 6,615,361 B1 * | 9/2003 | Patapoutian | G11B 20/10009 713/401 |
| 6,636,120 B2 | 10/2003 | Bhakta et al. | |
| 7,295,644 B1 * | 11/2007 | Wu | H03L 7/0807 375/375 |
| 7,643,235 B2 | 1/2010 | Erden et al. | |
| 7,733,588 B1 | 6/2010 | Ying | |
| 7,825,739 B2 * | 11/2010 | Higashino | G11B 20/10009 327/159 |
| 8,040,994 B1 * | 10/2011 | Patapoutian | H03L 7/1075 327/151 |

(Continued)

OTHER PUBLICATIONS

Sep. 20, 2016 File History for U.S. Appl. No. 14/808,721 retrieved from U.S. Patent and Trademark Office PAIR System on Sep. 20, 2016, 112 pages.

*Primary Examiner* — Kenneth Lam
(74) *Attorney, Agent, or Firm* — Hollingsworth Davis, LLC

(57) ABSTRACT

A phase-locked loop (PLL) filter of a read channel includes a filter portion having an input coupled to delay circuitry having an output. The input of the filter portion is configured to receive a phase error signal. A look-up table is coupled to the filter portion. The look-up table comprises phase coefficients and frequency coefficients associated with a plurality of phase error magnitudes. The look-up table is configured to provide one or both of a selected phase coefficient and a selected frequency coefficient based on a magnitude of the phase error signal. The PLL filter is configured to adjust a bandwidth of the filter portion using one or both of the selected phase coefficient and the selected frequency coefficient. A phase signal indicative of estimated phase disturbance is produced at the output of the delay circuitry.

10 Claims, 10 Drawing Sheets

(56) References Cited

U.S. PATENT DOCUMENTS

| | | |
|---|---|---|
| 8,570,679 B2 | 10/2013 | Wu et al. |
| 2003/0137765 A1 | 7/2003 | Yamazaki et al. |
| 2004/0004962 A1* | 1/2004 | Glazko ................ H04B 1/7075 |
| | | 370/375 |
| 2004/0252607 A1 | 12/2004 | Muzio et al. |
| 2005/0286353 A1* | 12/2005 | Hanano ................ G11B 7/0053 |
| | | 369/44.13 |
| 2006/0192620 A1 | 8/2006 | Beaulaton et al. |
| 2007/0064836 A1* | 3/2007 | Byrne .................... H04L 7/0054 |
| | | 375/326 |
| 2015/0030104 A1* | 1/2015 | Jeon ...................... H04L 1/0042 |
| | | 375/296 |
| 2015/0372682 A1* | 12/2015 | Alexeyev ................ H03L 7/085 |
| | | 327/156 |
| 2016/0028411 A1* | 1/2016 | Kuo ...................... G04F 10/005 |
| | | 327/107 |

\* cited by examiner

SELF-ADAPTING PHASE-LOCKED LOOP FILTER FOR USE IN A READ CHANNEL

SUMMARY

Embodiments are directed to a method comprising receiving a phase error signal by a phase-locked loop (PLL) filter of a read channel. The method comprises selecting from a look-up table one or both of a phase coefficient and a frequency coefficient based on a magnitude of the phase error signal. The method also comprises adjusting a bandwidth of a filter portion of the PLL filter using one or both of the selected phase coefficient and the selected frequency coefficient.

Various embodiments are directed to an apparatus comprising a phase-locked loop (PLL) filter of a read channel including a filter portion having an input coupled to delay circuitry having an output. The input of the filter portion is configured to receive a phase error signal. A look-up table is coupled to the filter portion. The look-up table comprises phase coefficients and frequency coefficients associated with a plurality of phase error magnitudes. The look-up table is configured to provide one or both of a selected phase coefficient and a selected frequency coefficient based on a magnitude of the phase error signal. The PLL filter is configured to adjust a bandwidth of the filter portion using one or both of the selected phase coefficient and the selected frequency coefficient. A phase signal indicative of estimated phase disturbance is produced at the output of the delay circuitry.

Other embodiments are directed to a method comprising receiving an error signal by a phase-locked loop (PLL) filter within a read channel. The method comprises detecting a change in a phase error of the error signal and producing a phase error signal. The method also comprises comparing the change in the phase error signal to a threshold. The method further comprises increasing a bandwidth of the PLL filter in response to the change in the phase error signal exceeding the threshold.

Further embodiments are directed to an apparatus comprising a phase detector of a read channel configured to receive an error signal. The phase detector is configured to detect a change in a phase error in the error signal and to produce a phase error signal. A phase-locked loop (PLL) filter is configured to receive the phase error signal and produce a phase signal. A threshold detector is coupled to the phase detector and the PLL filter. The threshold detector is configured to compare the change in the phase error signal to a threshold. The PLL filter is configured to increase its bandwidth in response to the change in phase error signal exceeding the threshold.

The above summary is not intended to describe each disclosed embodiment or every implementation of the present disclosure. The Figures and the detailed description below more particularly exemplify illustrative embodiments.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Figure 1:
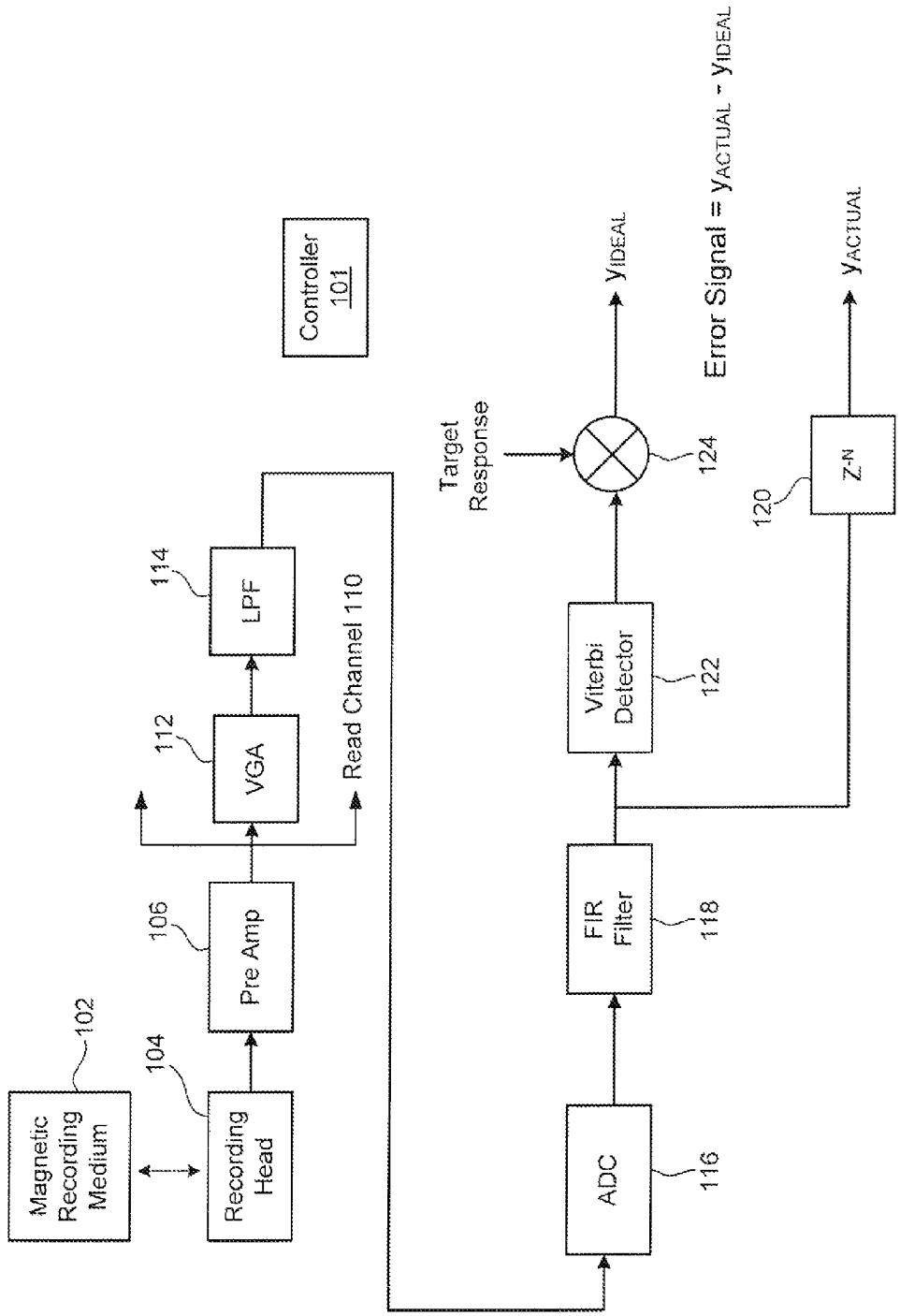
FIG. 1 illustrates components of a disk drive including a read channel in which PLL circuitry of the disclosure can be implemented according to various embodiments.

FIG. 1 illustrates components of a disk drive including a read channel in which PLL circuitry of the disclosure can be implemented according to various embodiments. The disk drive includes a recording head 104 in proximity to a magnetic recording medium 102. The head 104 includes at least a reader and a writer. In some embodiments, the head 104 is configured for heat-assisted magnetic recording and, in addition to a reader and a writer, includes an NFT proximate the writer, a laser source, and an optical waveguide that optically couples laser light from the laser source to the NFT. The reader (e.g., a magneto-resistive reader) of the head 104 senses the magnetic flux from the medium 102 and generates an analog read signal. The reader of the head 104 transmits a resistance read signal that is received by preamplifier 106, which converts the resistance signal into a voltage signal. The preamplifier 106 provides the voltage read signal to a read channel 110, in which embodiments of the disclosure can be implemented. A controller 101 (e.g., a microprocessor, ASIC, or other logic device) can be configured to coordinate operations of the components shown in FIG. 1 and the PLL circuitry shown in other figures.

The read channel 110 is generally configured to perform a partial response maximum likelihood (PRML) approach to detecting and decoding data read from the medium 102. Typical components of the read channel 110 include a variable gain amplifier (VGA) 112, a low pass filter 114, an analog-to-digital converter (ADC) 116, a digital filter 118, and a Viterbi detector 122 coupled to a decoder (not shown). The VGA 112 receives the read signal, in the form of a time-varying voltage signal, from preamplifier 101, and produces an amplified read signal in accordance with the tolerances of ADC 116, and transfers the read signal to the low pass filter 114. The filtered read signal is sampled by ADC 116. The samples produced by the ADC 116 are passed through the digital filter 118, such as a finite impulse response (FIR) digital filter, to fit the samples to the desired channel response. These samples are then allied to the Viterbi detector 122 which generates encoded data that can be decoded by the decoder to complete the maximum likelihood detection process.

As is shown in FIG. 1, the output of the Viterbi detector 122, such as a low-latency Viterbi decoder, is convolved with the target response to produce an ideal signal, $y_{IDEAL}$. The output of the digital filter 118 is coupled to a delay circuit 120 which produces an actual signal, $y_{ACTUAL}$. An error signal is produced as the difference between the actual signal, $y_{ACTUAL}$, and the signal, $y_{IDEAL}$. This error signal is processed by PLL circuitry in a manner described hereinbelow.

Figure 2:
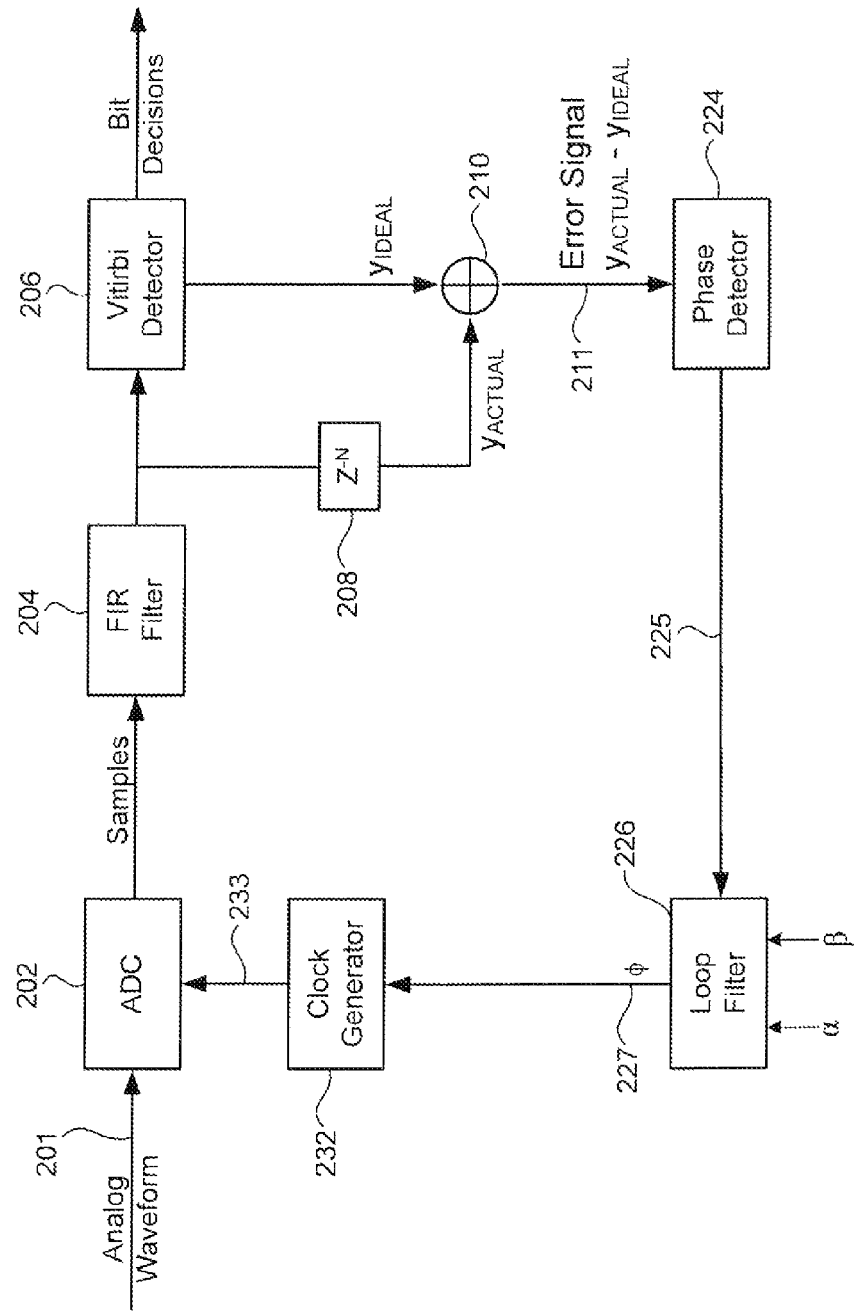
FIG. 2 illustrates PLL circuitry of a read channel in accordance with various embodiments.

FIG. 2 illustrates PLL circuitry of a read channel in accordance with various embodiments. FIG. 2 shows a portion of the read channel described previously in FIG. 1, including the ADC 202, the digital filter 204, the delay circuit 208, and the Viterbi detector 206. The PLL circuitry shown in FIG. 2 includes a phase detector 224 that receives an error signal ($y_{ACTUAL}$-$y_{IDEAL}$) 211 and produces a phase error signal 225 that corresponds to the phase difference between the analog waveform 201 and a clock signal 233 for the ADC 202. A loop filter 226 (e.g., a proportional-integral controller) is coupled to the phase detector 224 and receives the phase error signal 225 from the phase detector 224. A phase signal ($\phi$) 227 indicative of an estimated phase disturbance is produced at the output of the loop filter 226.

The loop filter 226 is configured to filter the phase error signal 225 and control how the PLL circuitry responds to errors, by utilizing coefficients to weight phase errors. The coefficients typically include a phase coefficient, $\alpha$, which affects phase adjustments to the clock signal 213, and a frequency coefficient, $\beta$, which affects frequency adjustments of the clock signal 213. Different phase and frequency coefficients can be used for an acquisition mode and a tracking mode. The acquisition mode coefficients are selected for fast and coarse adjustments of the clock signal 233. After a predetermined duration of time, such as a predetermined number of clock pulses, the tracking mode coefficients are substituted for the acquisition mode coefficients.

The tracking mode coefficients are typically selected to provide highly accurate phase adjustments. A clock generator 232 receives the phase signal 227 and is configured to generate a clock signal 233 which is communicated to the ADC 202.

Figure 3:
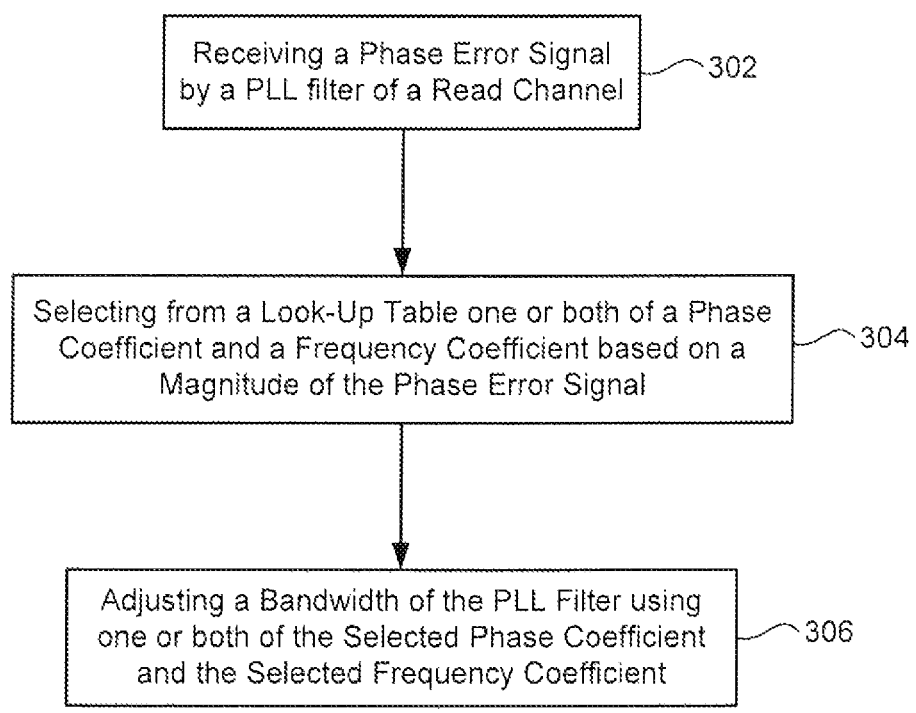
FIG. 3 illustrates various processes of an on-the-fly phase error compensation methodology in accordance with various embodiments.

FIG. 3 illustrates a method of modifying the filter bandwidth of PLL circuitry of a read channel in accordance with various embodiments. Modification of the PLL filter bandwidth according to FIG. 3 is implemented on-the-fly and an adaptive manner (e.g., self-adapting). The methodology shown in FIG. 3 involves receiving 302 a phase error signal by a PLL filter of the read channel. The method also involves selecting 304, from a look-up table, one or both of the phase coefficient and the frequency coefficient based on a magnitude of the phase error signal. The method further involves adjusting 306 a bandwidth of the PLL filter using one or both of the selected phase coefficient and the selected frequency coefficient.

FIG. 4A is a schematic of PLL circuitry of a read channel in accordance with various embodiments. The PLL circuitry shown in FIG. 4A is particularly well-suited for responding to large phase errors in a continuous and adaptive manner. The PLL circuitry shown in FIG. 4A includes a digital PLL (DPLL) filter 402, which is illustrated as a second order PLL filter. The PLL filter 402 includes a filter portion 404 having an input 410 configured to receive a phase error signal. At an output 412 of the filter portion 404, a filtered phase error signal is produced. The output 412 of the filter portion 404 is coupled to an input of delay circuitry 406 having an output 416. A phase signal indicative of an estimated phase disturbance is produced at the output 416 of the delay circuitry 406.

The PLL filter 402 utilizes a phase coefficient, $\alpha$, and a frequency coefficient, $\beta$, to weight phase errors present in the phase error signal and thus control how the PLL circuitry responds to errors. As was discussed above, the phase coefficient, $\alpha$, affects phase adjustments to the clock signal that controls the ADC and the frequency coefficient, $\beta$, affects frequency adjustments of the clock signal. Optimization of the PLL circuitry involves selection of appropriate coefficients, $\alpha$ and $\beta$, for the PLL filter 402. The coefficients, $\alpha$ and $\beta$, can be optimized for fast signal acquisition during an acquisition mode or for accurate tracking during a tracking mode. As is discussed above, different $\alpha$ and $\beta$ coefficients can be employed during an acquisition mode and during a tracking mode.

According to various embodiments, a look-up table 420 is coupled to the filter portion 404 of the PLL filter 402. The look-up table 420 stores phase coefficients, $\alpha_n$, and frequency coefficients, $\beta_n$, associated with a multiplicity of phase error magnitudes, $PEM_n$. FIG. 4B illustrates a representative look-up table 420. As is shown in FIG. 4B, each phase error magnitude, $PEM_n$, stored in the look-up table 420 has an associated phase coefficient, $\alpha_n$, and, an associated frequency coefficient, $\beta_n$. In some embodiments, the look-up table 420 also includes the sign (+ or −) of the phase error, as a given phase error has either a positive or negative sign or direction. The values of the phase coefficients, $\alpha_n$, and, frequency coefficients, $\beta_n$, associated with each phase error magnitude, $PEM_n$, can be determined during design and implementation of the PLL filter 402.

In some embodiments, the look-up table includes a maximum phase coefficient, $\alpha_{MAX}$, and a maximum frequency coefficient, $\beta_{MAX}$, each associated with a maximum phase error, $PEM_{MAX}$. In the case of a very large change in the phase error signal, the look-up table 420 may not contain phase and frequency coefficients appropriate for the very large phase signal change. In such cases, a maximum phase coefficient, $\alpha_{MAX}$, and/or frequency coefficient, $\beta_{MAX}$, can be selected in an attempt to compensate for the very large change in phase error signal presented to the filter portion 404. Applying a maximum phase coefficient, $\alpha_{MAX}$, and/or frequency coefficient, $\beta_{MAX}$, results in increasing the PLL filter bandwidth to its maximum limit.

The filter portion 404 operates as a low pass filter on the phase error signal which serves to average the timing error present in the filter portion 404. Depending on the magnitude and sign of the phase error present in the phase error signal, the timing error within the filter portion 404 can either increase or decrease. For example, when a jump or an abrupt change in the phase error signal occurs (e.g., such as due to a mode hop, as will be discussed hereinbelow), the look-up table 420 responds by selecting PLL filter coefficients, $\alpha_n$ and $\beta_n$, based on the magnitude and sign of the phase error signal change. Depending on the magnitude and sign of the phase error signal change (increase or decrease), one or both of a selected phase coefficient and a selected frequency coefficient can be communicated from the look-up table 420 to the filter portion 404. The filter portion 404 is configured to adjust its bandwidth using one or both of the selected phase coefficient and the selected frequency coefficient. The response of the PLL circuitry is thereby adjusted in a continuous and adaptive manner by application of the selected phase and/or frequency coefficients by the filter portion 404.

Figure 5:
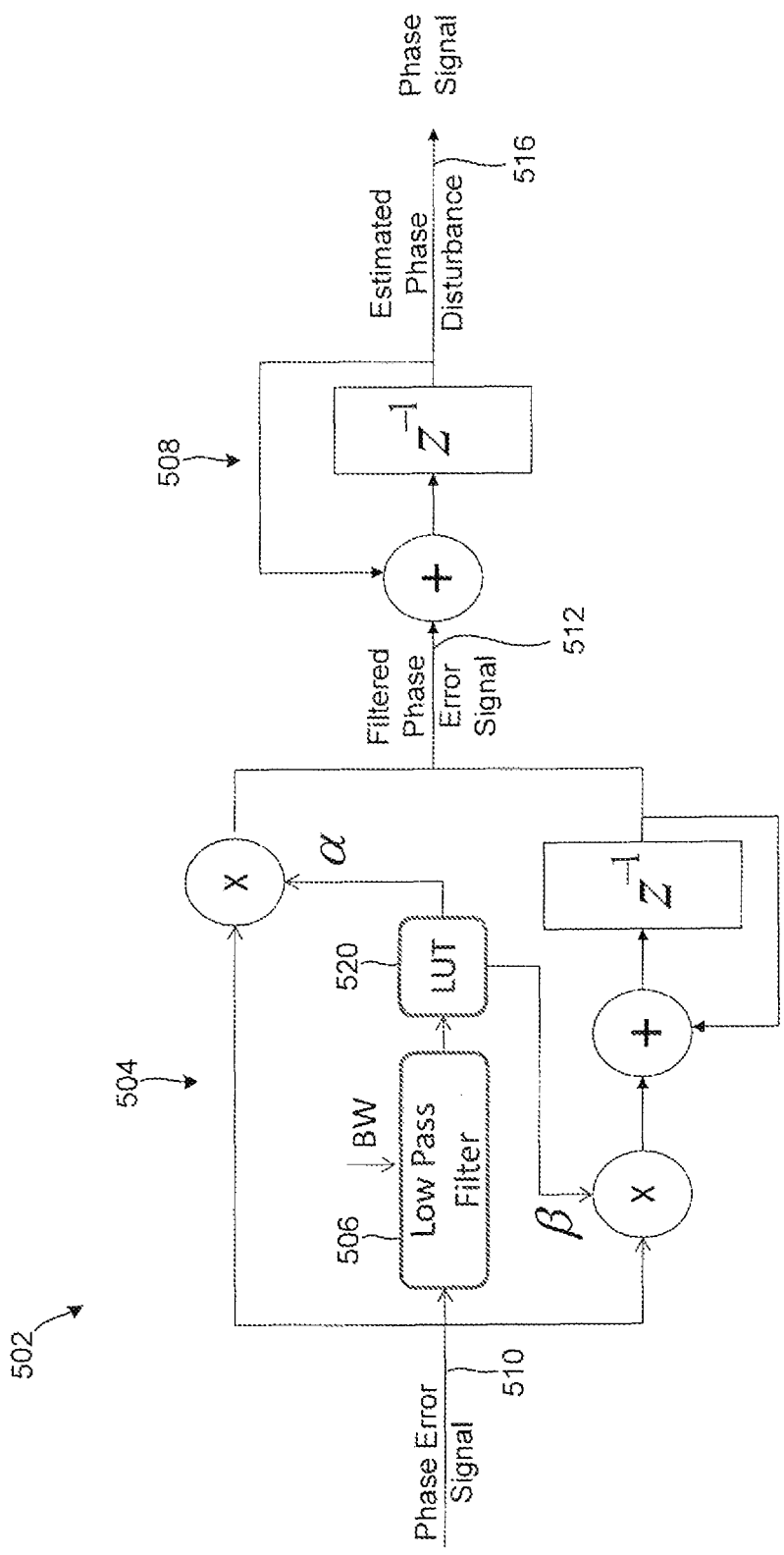
FIG. 5 is a schematic of PLL circuitry of a read channel in accordance with various embodiments.

FIG. 5 is a schematic of PLL circuitry of a read channel in accordance with other embodiments. The PLL circuitry shown in FIG. 5 is particularly well-suited for responding to large phase errors in a continuous and adaptive manner. The PLL circuitry shown in FIG. 5 includes a digital PLL filter 502, which is illustrated as a second order PLL filter. The PLL filter 502 includes a filter portion 504 having an input 510 configured to receive a phase error signal. At an output 512 of the filter portion 504, a filtered phase error signal is produced. The output 512 of the filter portion 504 is coupled to an input of delay circuitry 508 having an output 516. A phase signal indicative of an estimated phase disturbance is produced at the output 516 of the delay circuitry 508.

In the embodiment shown in FIG. 5, the filter portion 504 of the PLL filter 502 includes a low pass filter 506 which is configured to receive the phase error signal. An output of the low pass filter 506 is coupled to an input of a look-up table 520. The low pass filter 506 is configured to produce an averaged magnitude and sign of the phase error signal. The look-up table 520 stores phase coefficients, $\alpha_n$, and frequency coefficients, $\beta_n$, associated with a multiplicity of phase error magnitudes, $PEM_n$, and can be the same or similar to the look-up table 420 shown in FIG. 4B. In some embodiments, the low pass filter 506 generates a quantized version of the output comprising n (e.g., n=3) significant bits which is used to drive the look-up table 520. The quantized output of the low pass filter 506 is representative of an averaged phase error signal. The look-up table 520 responds to the quantized output of the low pass filter 506 by selecting one or both of a phase coefficient, $\alpha_n$, and a frequency coefficient, $\beta_n$, that correspond to the quantized low pass filter output.

The low pass filter 506 of the filter portion 504 serves to average the timing error present in the filter portion 504. The low pass filter 506 is preferably programmable (but is typically not adaptive), and can have a bandwidth (BW) that is based on phase jump and noise characteristics. The bandwidth (BW) of the low pass filter 506 is a parameter associated with the PLL filter 502, and represents the inverse of the window size used for the error estimation to select the corresponding PLL parameters during a phase jump.

As was discussed in the context of the embodiment illustrated in FIG. 4A, depending on the magnitude and sign of the phase error present in the phase error signal, the timing error within the filter portion 504 can either increase or decrease. For example, when a jump or an abrupt change in the phase error signal occurs (e.g., such as due to a mode hop), the look-up table 520 responds by selecting PLL filter coefficients, $\alpha_n$ and $\beta_n$, based on the magnitude and sign of the phase error signal change. Depending on the magnitude and sign of the phase error signal change (increase or decrease), one or both of a selected phase coefficient and a selected frequency coefficient can be communicated from the look-up table 520 to the filter portion 504. The filter portion 504 is configured to adjust its bandwidth using one or both of the selected phase coefficient and the selected frequency coefficient. The response of the PLL circuitry is thereby adjusted in a continuous and adaptive manner by application of the selected phase and/or frequency coefficients by the filter portion 504.

Figure 6:
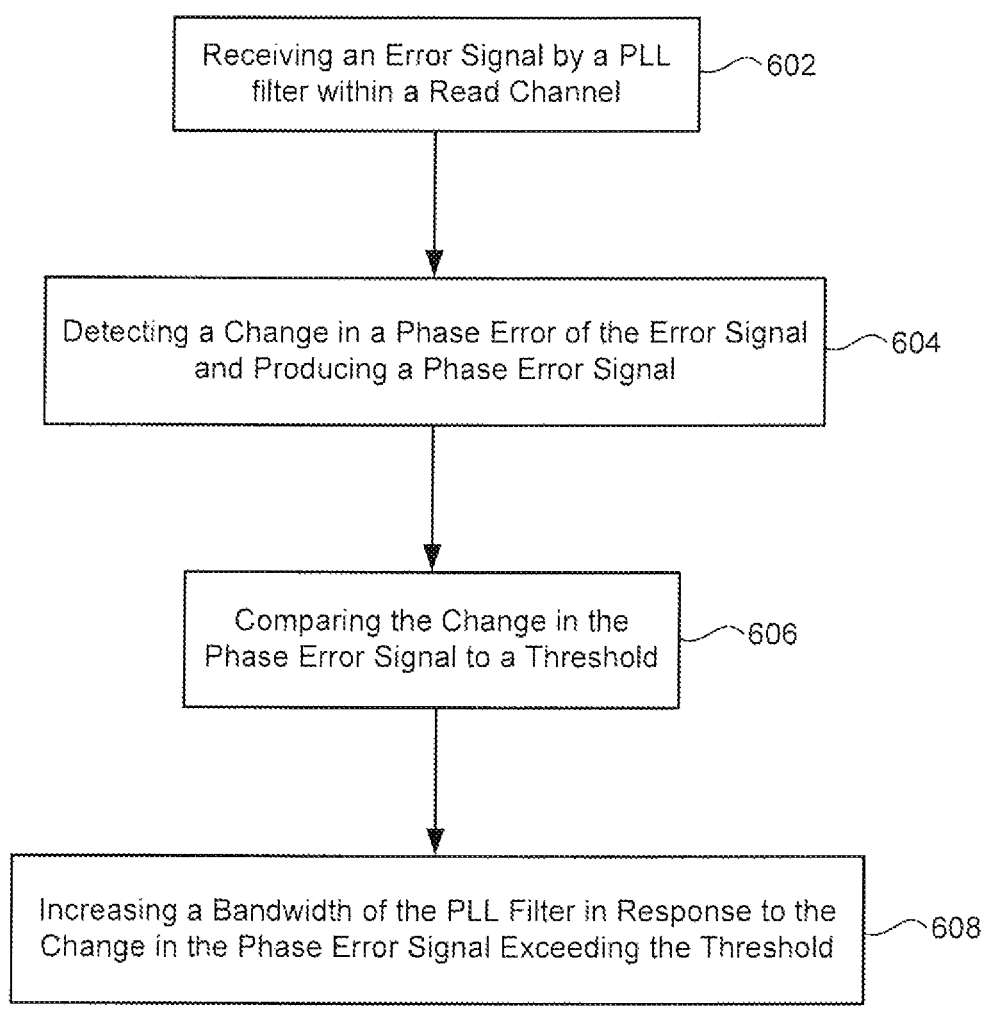
FIG. 6 illustrates a method of modifying the filter bandwidth of PLL circuitry of a read channel on-the-fly in accordance with various embodiments.

FIG. 6 illustrates a method of modifying the filter bandwidth of PLL circuitry of a read channel in accordance with various embodiments. Modification of the PLL filter bandwidth according to FIG. 6 can be implemented on-the-fly. The methodology shown in FIG. 6 involves receiving 602 an error signal by a PLL filter within a read channel. The method involves detecting 604 a change in a phase error of the error signal and producing a phase error signal. The method further involves comparing 606 the change in the phase error signal to a threshold. The method also involves increasing 608 a bandwidth of the PLL filter in response to the change in the phase error signal exceeding the threshold. In some implementations, operation of the PLL filter transitions from a tracking mode to an acquisition mode in response to the change in the phase error signal exceeding the threshold.

Figure 4:
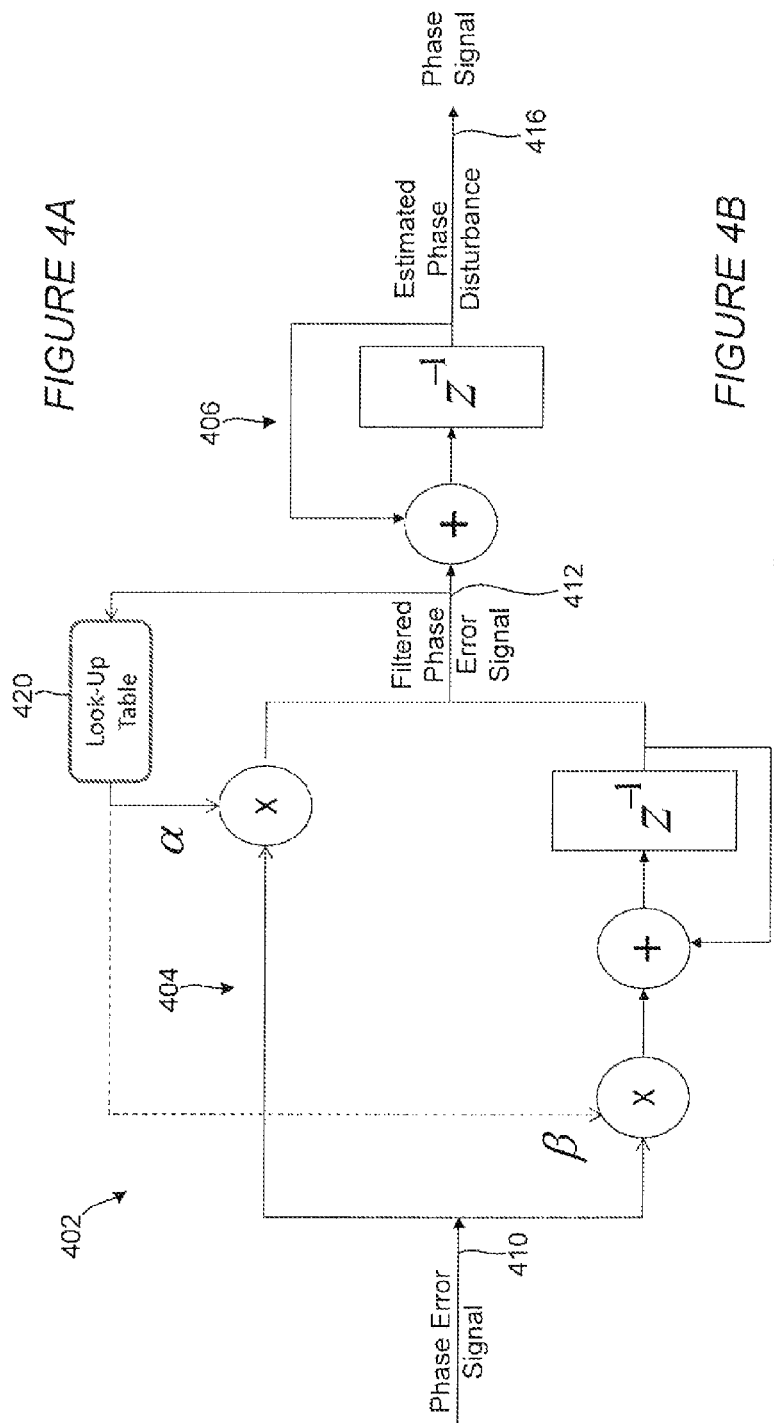
FIG. 4A is a schematic of PLL circuitry of a read channel in accordance with various embodiments.
FIG. 4B illustrates a representative look-up table configured to store PLL filter coefficients for use by the PLL circuitry shown in FIG. 4A and other figures in accordance with various embodiments.
Figure 7:
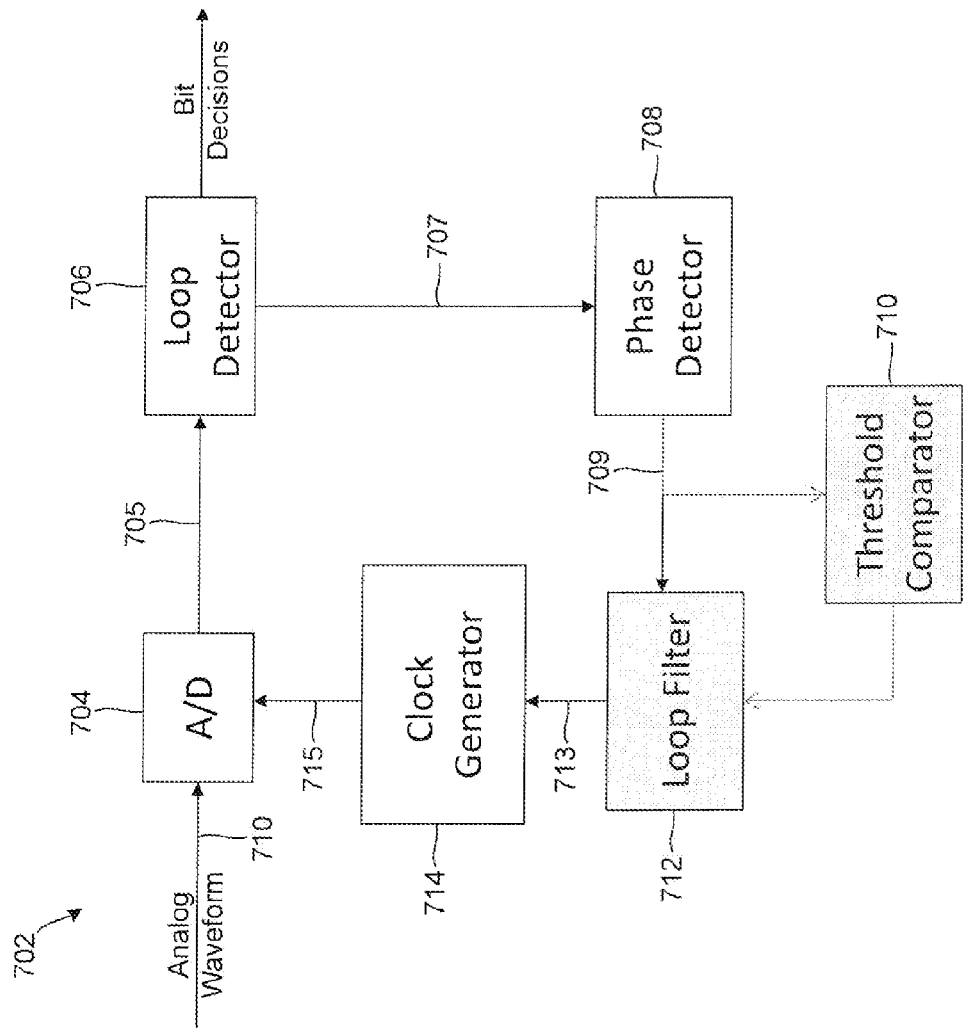
FIG. 7 is a schematic of a portion of a read channel and PLL circuitry in accordance with various embodiments.

FIG. 7 is a schematic of a portion of a read channel and PLL circuitry in accordance with various embodiments. The PLL circuitry 700 shown in FIG. 7 is particularly well-suited for responding to large phase errors on-the-fly. The embodiment shown in FIG. 7 differs from those shown in FIGS. 4A and 5 in that a thresholding technique is used as a mechanism for modifying the bandwidth of the PLL circuitry 700. In FIGS. 4 and 5, the PLL circuitry adapts continuously but the granularity action is governed by a look-up table. In the embodiment illustrated in FIG. 7, detection of a jump in the phase error results in an immediate adjustment of the PLL bandwidth in an attempt to respond to the large change in the phase error.

In the embodiment shown in FIG. 7, an analog waveform 701 produced by upstream components of the read channel is received by an ADC 704 which communicates digitized samples 705 of the analog waveform to a loop detector 706. The loop detector 706 may be a Viterbi detector, such as a low-latency Viterbi detector. The PLL circuitry 700 in FIG. 7 is shown to include a phase detector 708, a threshold comparator 710, and a loop filter 712 (e.g., digital PLL filter). An error signal 707 is input to the phase detector 708. The phase detector 708 is configured to detect a change in a phase error present in the error signal and to produce a phase error signal 709.

The threshold detector 710 is coupled to the phase detector 708 and the loop filter 712, and receives the phase error signal 709. The threshold detector 710 is configured to compare a change in the phase error signal 709 to a threshold, such as a programmed threshold. In response to the change in the phase error signal 709 exceeding the threshold, the loop filter 712 is configured to increase its bandwidth. For example, the bandwidth of the loop filter 712 may be increased by application of preprogrammed values for one or both of a phase coefficient, $\alpha$, and a frequency coefficient, $\beta$. In some embodiments, the loop filter 712 transitions from a tracking mode to an acquisition mode in response to the change in the phase error signal 709 exceeding the threshold. One or both of a phase coefficient, $\alpha$, and a frequency coefficient, $\beta$ programmed for the acquisition mode can be implemented by the loop filter 712. Adjustments to an ADC clock signal 715 are made by a clock generator 714 in response to the phase signal 713.

In heat-assisted magnetic recording devices, also sometimes referred to as thermal-assisted magnetic recording (TAMR) devices or energy assisted magnetic recording (EAMR), a magnetic recording medium (e.g., hard drive disk) is able to overcome superparamagnetic effects that limit the areal data density of typical magnetic media. In a HAMR recording device, information bits are recorded on a storage layer at elevated temperatures. The heated area in the storage layer determines the data bit dimension, and linear recording density is determined by the magnetic transitions between the data bits.

In order to achieve desired data density, a HAMR recording head (e.g., slider) includes optical components that direct light from a laser to the recording media. One of the major impairments to HAMR technology is a laser instability problem known as "mode hopping." One consequence of such laser instability is a sudden jump in the phase of the recorded waveform. Such phase jumps can occur in multiple consecutive sectors or even multiple times within the same sector. It is desirable to have an on-the-fly timing recovery procedure to track such jumps since an error recovery mode can significantly slow down drive performance. The various embodiments of PLL circuitry discussed hereinabove can be implemented in a read channel of a HAMR device.

In heat-assisted magnetic recording, a media hotspot (thermal hotspot) is created using the laser. This thermal hotspot generally needs to be smaller than a half-wavelength of light available from current sources (e.g., laser diodes). Due to what is known as the diffraction limit, optical components cannot focus the light at this scale. One way to achieve tiny confined hot spots is to use an optical near-field transducer (NFT), such as a plasmonic optical antenna. The NFT is designed to support local surface-plasmon at a designed light wavelength. At resonance, high electric field surrounds the NFT due to the collective oscillation of electrons in the metal. Part of the field will tunnel into a magnetic recording medium and get absorbed, raising the temperature of the medium locally for recording. During recording, a write element (e.g., write pole) allies a magnetic field to the heated portion (thermal hotspot) of the medium. The heat lowers the magnetic coercivity of the medium, allowing the allied field to change the magnetic orientation of heated portion. The magnetic orientation of the heated portion determines whether a one or a zero is recorded. By varying the magnetic field allied to the magnetic recording medium while it is moving, data is encoded onto the medium.

Figure 8:
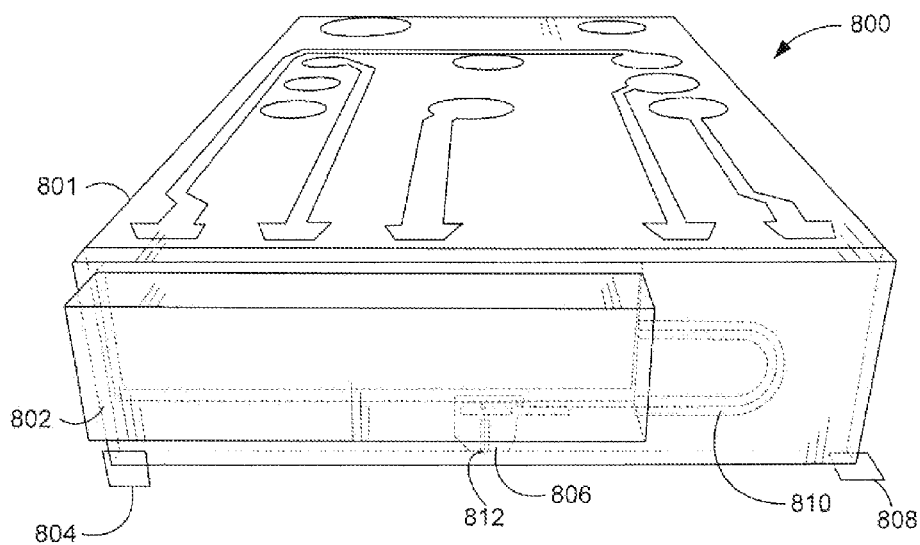
FIG. 8 shows a perspective view of a heat-assisted magnetic recording (HAMR) slider configuration according to some representative embodiments.
Figure 9:
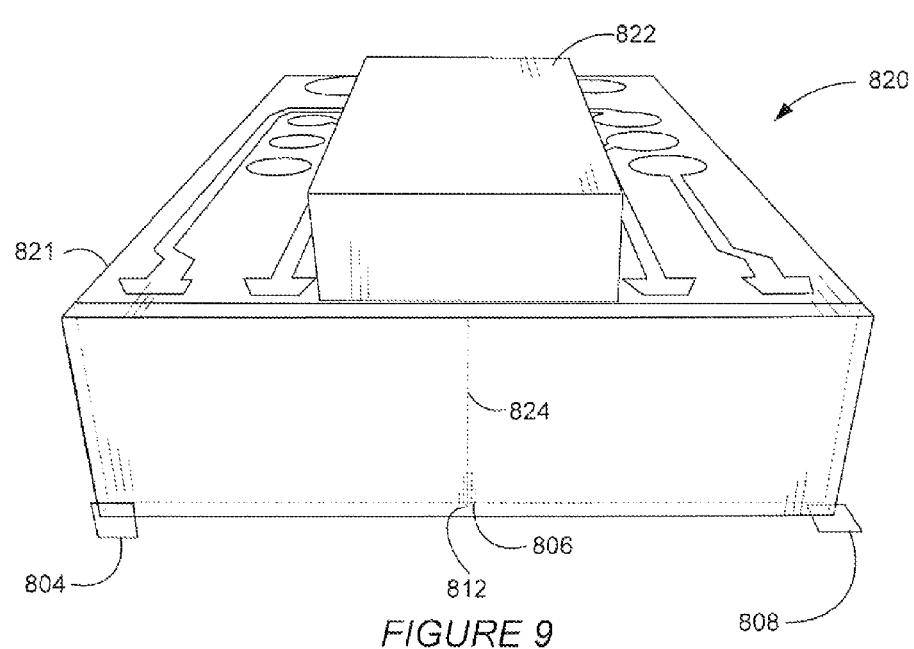
FIG. 9 shows a perspective view of a HAMR slider configuration according to other representative embodiments.

A HAMR drive, for example, uses a laser diode to heat the magnetic recording medium to aid in the recording process. FIGS. 8 and 9 show perspective views of HAMR slider configurations according to representative embodiments. For simplicity, like reference numbers are used in FIGS. 8 and 9. In FIG. 8, a slider 800 has a laser-in-slider (LIS) configuration. In this configuration, the slider 800 includes a slider body 801 having an edge-emitting laser diode 802 integrated into a trailing edge surface 804 of the slider body 801. In this example, the laser diode 802 is disposed within a cavity formed in the trailing edge surface 804. The laser diode 802 is proximate to a HAMR read/write element 806, which has one edge on an air bearing surface 808 of the slider 800. The air bearing surface 808 faces and is held proximate to a moving media surface (not shown) during device operation.

While here the read/write element 806 is shown as a single unit, this type of device may have a physically and electrically separate read element (e.g., magnetoresistive stack) and write element (e.g., a write coil and pole) that are located in the same general region of the slider 800. The separate read and write portion of the read/write element 806 may be separately controlled (e.g., having different signal lines, different head-to-media spacing control elements, etc.), although may share some common elements (e.g., common signal return path). It will be understood that the concepts described relative to the read/write element 806 may be applicable to individual read or write portions thereof, and may be also applicable where multiple ones of the read write portions are used, e.g., two or more read elements, two or more write elements, etc.

The laser diode 802 provides electromagnetic energy to heat the media surface at a point near to the read/write element 806. Optical path components, such as a waveguide 810, are formed integrally within the slider 800 to deliver light from the laser diode 802 to the media. In particular, a local waveguide and NFT 812 may be located proximate the read/write element 806 to provide local heating of the media during write operations.

Various components (e.g., 806, 812, including the laser diode 802) may also experience significant heating due to light absorption and electric-to-optical conversion inefficiencies as energy produced by the laser diode 802 is delivered to the magnetic recording medium (not shown). During write operation, these light absorption and inefficiencies will vary the junction temperature of the laser diode, causing a shift in laser emission wavelength, leading to a change of optical feedback from optical path in slider to the cavity of the laser diode 802, a phenomenon that is known to lead to frequency mode hopping of the laser diode 802. Mode hopping is particularly problematic in the context of single-frequency lasers. Under some external influences, a single-frequency laser may operate on one resonator mode (e.g., produce energy with a first wavelength) for some time, but then suddenly switch to another mode (produce energy with a second wavelength) performing "mode hopping." It is thought that mode hopping is caused by a temperature induced change in external optical feedback, mainly due to the shift in gain peak wavelength from a change in band gap with temperature. Temperature induced changes in the index of refraction and the thermal expansion of the materials that form the laser cavity can also contribute to mode hopping. Both of these cause the mode wavelength to increase but the contribution from the latter, typically 0.06 nm/K, is much smaller than the peak gain shift, typically 0.25 nm/K. As the temperature at the laser diode junction increases, the gain peak will overtake the modes leading to mode hopping.

Mode hopping is problematic for HAMR application's, as mode hopping leads to laser output power jumping and magnetic transition shifting from one block of data to another. For example, mode hopping results in shifting of the thermal hotspot from its expected location, causing an abrupt shift in write phase and timing-induced errors when reading data at locations impacted by the mode hop. Large transition shifts in a block of data cannot be recovered using conventional channel decoding, resulting in error bits.

In FIG. 9, a laser-on-slider (LOS) configuration 820 is illustrated. This example includes a laser diode 822 that is mounted on a top surface of a slider body 821. The laser diode 822 is coupled to an optical path of the slider body 821 that includes, among other things, an optical path 824 (e.g., a straight waveguide). In this configuration, the laser diode 822 may also be edge-emitting, such that the light is emitted from the laser diode 822. In order to direct the light towards the air bearing surface 808, the laser diode 822 (or other component) may include optical path elements such as a mirror (not shown) that redirects the light emitted from the laser diode 822 towards the air bearing surface 808. In other configurations, an edge-emitting, top-mounted laser diode may be oriented so that the light emitted directly downwards toward the air bearing surface 808. This may involve placing the laser diode 822 on a submount (not shown) on the top of the slider body 821, the submount orienting the laser output in the desired direction.

While other components shown in FIG. 9, such as the NFT 812 and read/write element 806, are referenced using the same numbers as FIG. 8, the physical configuration of these and other components may differ in the different slider arrangements, e.g., due to the differences in optical coupling pathways, materials, laser power, etc. However, similar to the configuration shown in FIG. 8, the laser diode 822 shown in FIG. 9 may experience mode hopping due to writing-induced temperature changes and due to return light (i.e. reflections back into light source) from the light path as well as from the magnetic recording medium.

Figure 10:
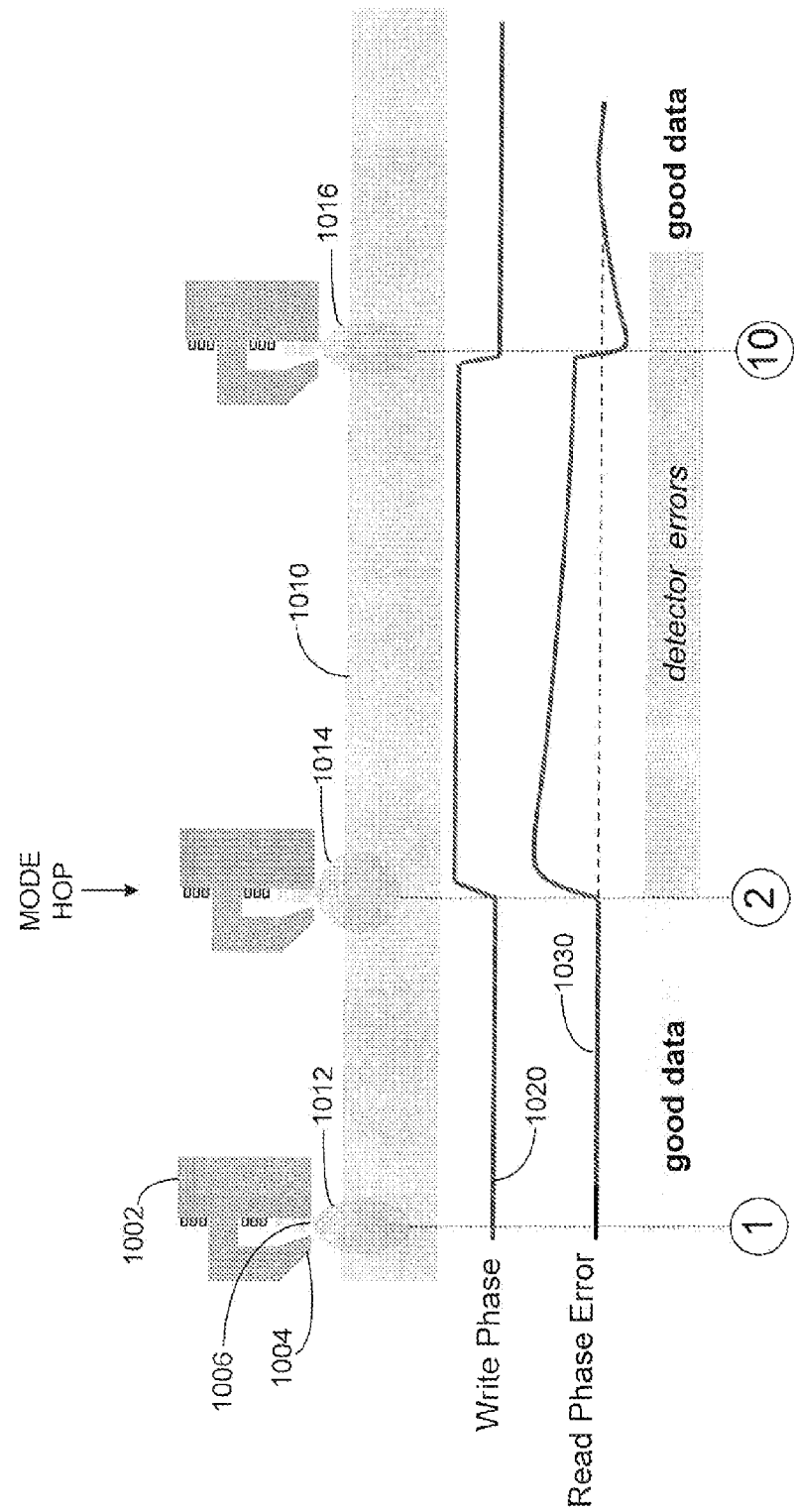
FIG. 10 illustrates a frequency mode hop that occurs when writing data to a magnetic recording medium using a HAMR head.

FIG. 10 illustrates a frequency mode hop that occurs when writing data to a magnetic recording medium using a HAMR head. A frequency mode hop occurring in the laser diode of the HAMR head results in creation of a thermal spot on the magnetic recording medium having a size different from an expected size. The abnormal size (too large or too small) of the thermal spot created during a frequency mode hop results in an abrupt shift in the write phase which, if undetected/uncorrected, results in a corresponding abrupt shift in a read phase error when reading data from the impacted location of the medium. Timing-induced errors around the mode hop are experienced when reading the data from the impacted location of the medium.

In FIG. 10, a HAMR head 1002 is shown to include a writer 1004 positioned proximate an NFT 1006. At position 1 of the medium 1010, the writer 1002 creates a thermal spot 1012 having a normal size which is then magnetized (written to) by the writer 1004. At position 2 on the medium 1010, the writer 1002 creates a thermal spot 1014 having an enlarged size relative to thermal spot 1012. Writing the enlarged thermal spot 1014 at location 2 by the writer 1002 causes an abrupt shift in the write phase 1020. At position 3 of the medium 1010, the writer 1002 creates a thermal spot 1016 having a normal size equivalent to that of thermal spot 1012, resulting in a normal written phase 1020.

Creation of the enlarged thermal spot 1014 results in a shifting of the center of the thermal spot 1014 from an expected location had the thermal spot 1014 been of a normal size. In the case of an enlarged thermal spot 1014 (as is shown in FIG. 10), the thermal spot 1014 is located closer to the first thermal spot 1012 than expected, resulting in a positive change in the written phase 1020. In some cases, the writer 1002 can create a thermal spot that is smaller than expected, in which case the center of the smaller thermal spot would be located further from the previous (normal) thermal spot than expected, resulting in a negative change in the written phase 1020. A negative change in the written phase 1020 is shown at position 3 of the medium 1010, due to the distance between the center of the enlarged thermal spot 1014 and that of the normal thermal spot 1016 being greater than an expected distance. In either case, an abrupt shift in write phase occurs in response to writing either an enlarged thermal spot or a thermal spot that is smaller than expected.

FIG. 10 shows a read phase error 1030 in time alignment with the write phase 1020. Good data is read between positions 1 and 2 on the medium 1010. At position 2, an abrupt change in the read phase error 1030 occurs due to the corresponding abrupt change in the write phase 1020 at location 2. Detector errors occur between positions 2 and 3 on the medium 1010 due to the read channels inability to compensate for the abrupt change in the read phase error 1030. Using conventional implementations, the abrupt change in the read phase error 1030 due to a frequency mode hop generally results in unrecoverable data at the impacted location of the medium 1010.

Figure 11:
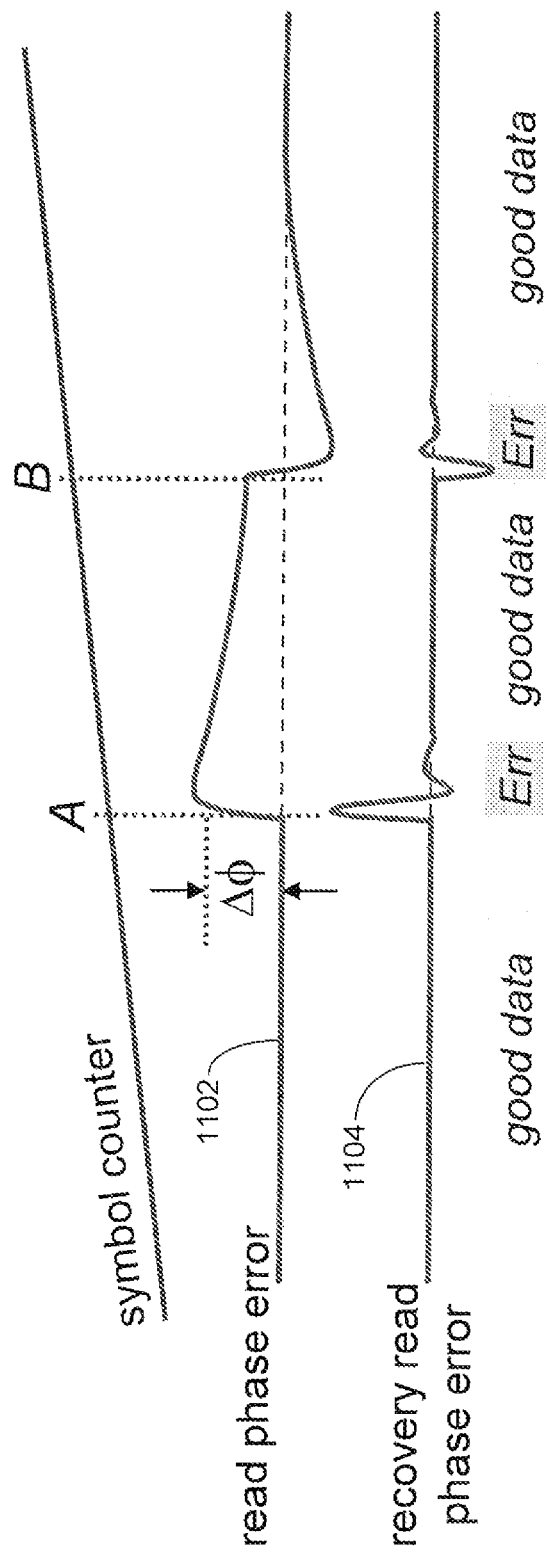
FIG. 11 illustrates read phase errors that occur when reading data from locations of medium that were written during a frequency mode hop of the HAMR head's laser diode.

FIG. 11 illustrates a read phase error that occurs when reading data from a location of a recording medium that was written during a frequency mode hop of a HAMR head's laser diode. FIG. 11 also shows how the read phase error is reduced in accordance with embodiments of the disclosure. In FIG. 11, an abrupt change in the read phase error 1102 ($\Delta\phi$) can be seen to occur at symbol A. The abrupt change in the read phase error 1102 at symbol A results from reading a data sector that was written during a frequency mode hop. It is noted that the abrupt change in the read phase error 1102 at symbol A may result from a phenomena or event other than a mode hop.

Phase error adjustment circuitry of the present disclosure operates to address the increase in the read phase error 1102 between symbols A and B by increasing the PLL bandwidth. The recovery read phase error 1104 shows a recovery error (Err) at symbol A indicative of the response of the PLL circuitry to a sudden increase in bandwidth (e.g., due to the transient of introducing a compensating feedforward phase correction at symbol A). It is noted that the recovery read phase error 1104 is near zero after symbol A, even though the symbols between A and B are written with the suddenly shifted phase via the compensating feedforward phase correction. The upward blip at symbol A and the downward blip at symbol B is characteristic of a high-pass response that would be expected from a sudden increase in the PLL bandwidth upon detecting a phase error jump (due to the larger thermal hotspot at symbol A and return to a normal sized hotspot at symbol B). Alternatively, the upward blip at symbol A and the downward blip at symbol B can be considered transients from imperfect (real-world) injection and subsequent removal of a feedforward phase intended to cancel the phase shift between symbols A and B.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

What is claimed is:

1. An apparatus, comprising:
a phase-locked loop (PLL) filter of a read channel comprising a filter portion having an input coupled to delay circuitry having an output, the input of the filter portion configured to receive a phase error signal;
a look-up table coupled to the filter portion, the look-up table comprising phase coefficients and frequency coefficients associated with a plurality of phase error magnitudes, the look-up table configured to provide one or both of a selected phase coefficient and a selected frequency coefficient based on a magnitude of the phase error signal; and
the PLL filter configured to adjust a bandwidth of the filter portion using one or both of the selected phase coefficient and the selected frequency coefficient;
wherein a phase signal indicative of estimated phase disturbance is produced at the output of the delay circuitry, the filter portion comprises a low pass filter configured to receive the phase error signal, and an output of the low pass filter is coupled to an input of the look-up table.

2. The apparatus of claim 1, wherein:
the low pass filter is configured to produce an averaged magnitude and sign of the phase error signal.

3. The apparatus of claim 1, wherein:
the low pass filter is configured to produce an averaged magnitude and sign of the phase error signal; and
the look-up table is configured to determine one or both of the selected phase coefficient and the selected frequency coefficient using the averaged magnitude and sign of the phase error signal.

4. The apparatus of claim 1, wherein:
the look-up table comprises a maximum phase coefficient and a maximum frequency coefficient; and
the look-up table is configured to provide one or both of the maximum phase coefficient and the maximum frequency coefficient in response to the phase error signal exceeding a maximum phase error signal for which phase and frequency coefficients are available in the look-up table.

5. The apparatus of claim 1, wherein:
the filter portion is configured to operate on a phase error signal indicative of a mode hop; and
the look-up table contains phase coefficients and frequency coefficients for responding to the mode hop.

6. A method, comprising:
receiving a phase error signal by a phase-locked loop (PLL) filter of a read channel;
selecting from a look-up table one or both of a phase coefficient and a frequency coefficient based on a magnitude of the phase error signal;
determining, by the look-up table, one or both of the selected phase coefficient and a selected frequency coefficient using an averaged magnitude and sign of the phase error signal; and
adjusting a bandwidth of a filter portion of the PLL filter using one or both of the selected phase coefficient and the selected frequency coefficient.

7. The method of claim 6, further comprising low pass filtering the received phase error signal.

8. The method of claim 7, wherein low pass filtering the received phase error signal comprises producing the averaged magnitude and sign of the phase error signal.

9. The method of claim 6, wherein:
the look-up table comprises a maximum phase coefficient and a maximum frequency coefficient; and
selecting comprises selecting one or both of the maximum phase coefficient and the maximum frequency coefficient from the look-up table in response to the phase error signal exceeding a maximum phase error signal for which phase and frequency coefficients are available in the look-up table.

10. The method of claim 6, wherein:
a change in the phase error signal is indicative of a mode hop; and
selecting comprises selecting one or both a phase coefficient and a frequency coefficient for responding to the mode hop.

* * * * *